United States Patent [19]

Janssen

[11] Patent Number: 4,640,727
[45] Date of Patent: Feb. 3, 1987

[54] GRAPHIC DESIGN ARTICLE

[75] Inventor: Jeffrey R. Janssen, Woodbury, Minn.

[73] Assignee: Minnesota Mining and Manufacturing Company, St. Paul, Minn.

[21] Appl. No.: 695,693

[22] Filed: Jan. 28, 1985

[51] Int. Cl.⁴ .................. B44C 1/00; B41M 3/12; B32B 3/00
[52] U.S. Cl. .................... 156/240; 156/230; 427/54.1; 427/146; 427/147; 427/208.4; 428/195; 428/204; 428/345; 428/914
[58] Field of Search ............... 428/914, 195, 345, 204; 427/54.1, 146, 208.4, 147; 156/240, 230

[56] References Cited

U.S. PATENT DOCUMENTS

| | | | |
|---|---|---|---|
| 3,684,544 | 8/1972 | Piron | 117/3.1 |
| 3,987,225 | 10/1976 | Reed et al. | 428/43 |
| 4,028,165 | 6/1977 | Rosenfeld | 156/234 |
| 4,028,474 | 6/1977 | Martin | 428/40 |
| 4,177,309 | 12/1979 | Shadbolt et al. | 428/914 |
| 4,286,008 | 8/1981 | Reed et al. | 428/195 |
| 4,287,255 | 9/1981 | Wong et al. | 428/345 |
| 4,288,479 | 9/1981 | Brack | 428/914 |
| 4,288,525 | 9/1981 | Shepherd et al. | 430/253 |
| 4,318,953 | 3/1982 | Smith | 428/204 |
| 4,326,005 | 4/1982 | Reed et al. | 428/204 |
| 4,337,289 | 6/1982 | Reed et al. | 428/195 |
| 4,454,179 | 6/1984 | Bennett et al. | 428/41 |
| 4,458,003 | 7/1984 | Shepherd et al. | 430/273 |
| 4,496,618 | 1/1985 | Pernicano | 428/204 |
| 4,517,044 | 5/1985 | Arnold | 428/202 |

FOREIGN PATENT DOCUMENTS 2053497 2/1981 United Kingdom .

Primary Examiner—Herbert J. Lilling
Attorney, Agent, or Firm—Donald M. Sell; James A. Smith; James V. Lilly

[57] ABSTRACT

A graphic design article comprising a carrier transparent to actinic radiation, a first adhesive layer on the carrier, a graphic design on portions of the first adhesive layer, and a second adhesive layer on the graphic design and first adhesive layer.

The carrier and first adhesive layer are transmissive to actinic radiation. The graphic design is opaque to actinic radiation. The second adhesive layer is responsive to actinic radiation.

31 Claims, 8 Drawing Figures

GRAPHIC DESIGN ARTICLE

TECHNICAL FIELD

This invention relates to a graphic design article and to methods for making and using the same. More particularly it relates to an article and method for applying a graphic design article to substrates, such as automobile bodies, to provide a design thereon.

BACKGROUND ART

On site application of paint directly to a surface to be decorated is the time-honored method for providing a graphic design such as a decorative design. While this provides many aesthetic and physical features including realistic appearance, color flexibility, and durability to abrasion, weathering, and chemical attack, it also suffers from many disadvantages. Such disadvantages include the need for relatively skilled labor, long application times, and potential contamination to adjacent areas (particularly mechanical equipment). Prefabricated film graphics have been utilized to avoid many of these disadvantages. Such graphics can be manufactured at a convenient location and subsequently applied by relatively unskilled labor on site efficiently with virtually no threat of contamination or health hazard.

One type of prefabricated graphic comprises sheets of polymeric film bearing a graphic design and a non-registered layer of adhesive under the graphic design which is protected by a liner. The sheets are die and/or "kiss cut" to provide the desired design. The design is bonded to the substrate by means of the adhesive layer after removal of the liner. Such graphics are expensive owing to the large capital investment in equipment, and are generally limited to relatively simple configurations. Furthermore, accurate die and/or "kiss cutting" is difficult to achieve. Moreover, there is a substantial amount of material waste inherent with this method.

While die and/or "kiss cutting" does serve to provide a dry transfer article in which the adhesive is in registry with the article, registry may also be accomplished by exact registered application of the adhesive to the graphic design. U.S. Pat. Nos. 4,028,474 and 4,028,165 exemplify this approach. There is general recognition, however, that it is difficult and sometimes costly to achieve satisfactory alignment of adhesive and graphic, especially for intricate patterns.

Other approaches are known for aligning adhesive with the graphic design. For example, in U.S. Pat. No. 3,684,544, the adhesive is initially covered with a continuous silica coating which interferes with bonding the article to the substrate. Silica is displaced by adhesive in the regions underlying the ink design as a result of altering the adhesive rheology by applying pressure to the article to release a fluidity agent from the ink.

U.S. Pat. No. 4,286,008 discloses an article in which a photopolymerizable ink is screen printed onto a carrier film. In one embodiment, an article is provided with an adhesive layer overlapping the ink layer. Cleavage of the adhesive layer along the edge of the ink is said to occur.

U.S. Pat. No. 3,987,225 discloses an article of the type having a continuous adhesive layer. The adhesive is edge stressed by incorporating a solvent or dispersing powder in the adhesive. This is said to permit the adhesive to shear cleanly along the edge of the design, eliminating residual particles, or strings of adhesive.

U.S. Pat. No. 4,288,525 discloses a peel-apart dry transfer material in the form of opposing support layers. A continuous photosensitive layer and a continuous image-forming layer is sandwiched between the opposing support layers. The image-forming layer may contain an adhesive component, or a separate adhesive layer may be provided between the image-forming layer and an adjacent carrier film, or the adhesive may be applied after the exposure and peel-apart development. One use of the dry transfer material is to place the developed structure on a rigid, transparent support, adhesive-side down, and irradiate through the support to provide a strong bond such that the carrier film can then be stripped away leaving the photosensitive layer, the image layer, and the adhesive bonded to the substrate.

United Kingdom Patent 2,053,497 discloses a peel-apart laminate composed of opposing carrier sheets which are transparent or translucent, between which are sandwiched a continuous image-forming layer or at least one further layer which is photosensitive, and an adhesive layer. After imagewise exposure to actinic radiation through a transparency, the laminate is peeled apart providing two decals or signs, one a positive and the other a negative. Either is applied adhesive-side down to a substrate with the carrier sheet providing a protective covering for the underlying image layer.

The aforementioned patents describe approaches which rely upon mechanisms which are difficult to control or which, in some cases, dictate use of materials unable to withstand demanding environments to achieve clean separation/development of the transfer material elements. In other instances, the development mechanism dictates use of a single color graphic; a severe limitation to general use of the article. Further, in the case of prior photosensitive dry transfer articles, there is dependence upon the use of an external mask to provide the exposure pattern of actinic radiation for creation of the latent image.

Yet another approach is provided in U.S. Pat. No. 4,454,179 which discloses an article having a continuous, actinic radation-transparent support, a continuous layer of an actinic radiation responsive adhesive and a graphic design interposed between the adhesive and the support. The graphic design is applied in a predetermined manner and is opaque to actinic radiation so that after the article has been exposed to such radiation through the support and applied to a substrate, removal of the support allows selective separation of the support and the exposed portions of the adhesive from the substrate along the edges of the graphic design. The design and the underlying unexposed portions of the adhesive remain on the substrate. This patent describes only articles made in reverse order, that is the final color is the first applied to the support after which the adhesive layer is applied. The use of reverse order manufacture makes color matching difficult when more than one color is to be employed in the graphic design. Additionally, this patent describes the direct application of the graphic to the support. Generally only low adhesive forces hold the graphic to the support. This can lead to difficulty in positioning, or repositioning, the graphic on the substrate as the graphic may release prematurely from the support.

DISCLOSURE OF THE INVENTION

The present invention provides an article comprising a continuous support film or carrier, a continuous first adhesive coating or layer on the carrier, a graphic design on first portions of the first adhesive layer, and a continuous second adhesive coating or layer over the graphic design and second portions of the first adhesive layer. After exposing the article to actinic radiation and locating or positioning it on the substrate so that the second adhesive layer contacts the substrate, the carrier, the first adhesive layer and the second adhesive layer over the second portions of the first adhesive layer are selectively removed, leaving only the graphic design and the underlying second adhesive layer on the substrate. This selective removal occurs by cleavage of the graphic design from the first adhesive layer and from the second adhesive layer at the edges of the graphic.

The cleavage and separation step, also referred to as development herein, results in only the ink and the underlying second adhesive layer being retained on the substrate. Development does not rely upon release of agents to disrupt bonds nor does it rely upon selective application of pressure by burnishing. Moreover, graphic designs and adhesives may be employed in the article of this invention which are capable of withstanding chemically and physically disruptive forces that have served to limit use of the transfer articles as direct paint substitutes for many purposes, especially exterior usage where abrasive or environmental conditions are severe.

The foregoing combination of advantages, heretofore unobtainable, are achieved by providing a dry transfer article for transferring a graphic design to a substrate comprising (a) a carrier which is transmissive to actinic radiation and which is preferably capable of intimately conforming to compound surfaces;

(b) a first adhesive layer on the carrier which first adhesive layer is transmissive to actinic radiation and presents a major surface having first and second portions thereon;

(c) a graphic design on the first surface portions and which is opaque to actinic radiation; and (d) a continuous second adhesive layer which is responsive to actinic radiation and which covers the graphic design and the second portions of the first adhesive layer, and optionally;

(e) a protective liner over the second adhesive layer.

Upon exposure of the article to actinic radiation through the carrier and application of the article to the substrate, removal of the carrier, the first adhesive layer and second adhesive layer on the second surface portions of the first adhesive layer selectively separate from the graphic design and leave only the graphic design and the second adhesive layer in registry therewith on the substrate.

Also provided is a process of making a dry, graphic design article comprising the steps of (a) providing a continuous, actinic radiation-transparent carrier which preferably is capable of intimately conforming to compound surfaces, (b) applying a layer of an actinic radiation transmissive first adhesive composition to a major surface of said carrier so as to provide first and second portions thereon; (c) applying an actinic radiation opaque graphic design, to the first portions of the first adhesive layer, and (d) applying a continuous layer of actinic radiation-responsive second adhesive composition over the graphic design and the second surface portions of the first adhesive layer.

Still further, there is provided a method for the on-site application of a graphic design article to a substrate comprising providing the graphic design article, exposing it to actinic radiation through the carrier, applying the exposed article to a substrate so that the second adhesive layer contacts the substrate, and removing the carrier from the article and thereby selectively separating the carrier, the first adhesive layer and the second adhesive layer on the second surface portions from the article along the surface and edges of the graphic design, leaving the graphic design and the second layer of adhesive in registry therewith on the substrate.

In the present invention the ability to develop the exposed graphic design article depends upon the proper balance of the adhesive and cohesive forces between the various layers during development. While there are many force relationships involved, the principal ones to consider are the forces of adhesion between the carrier film and the first adhesive layer; between the first adhesive layer and the actinic radiation-exposed second adhesive layer; between the first adhesive layer and the graphic design; between the actinic radiation-exposed second adhesive layer and the substrate; between the graphic design and the second adhesive layer in registry therewith; and between the second adhesive layer in registry with the graphic design and the substrate.

The article of this invention achieves the proper balance among the various relevant forces by the appropriate selection of materials, and the treatment of those materials.

BRIEF DESCRIPTION OF THE DRAWINGS

The invention is further explained with reference to the following drawings wherein.

DETAILED DESCRIPTION

Figure 1:
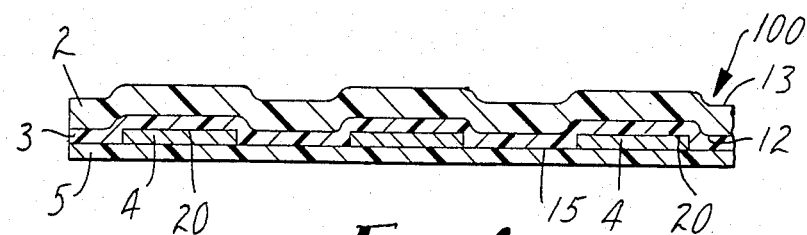
FIG. 1 is a cross-section view of the article of the invention prior to exposure to actinic radiation.

Referring to FIG. 1, article 100 comprises a continuous, actinic radiation transparent carrier film 2 having first and second major surfaces 12 and 13 respectively. A first adhesive layer 3, adhered to first surface 12, is transmissive to actinic radiation and may either be responsive or non-responsive to such radiation. An actinic radiation opaque graphic design 4 is adhered to first adhesive layer 3 at first surface portions 20. A continuous actinic radiation responsive second adhesive layer 5 is adhered to and covers graphic design 4 and second surface portions 15 of first adhesive layer 3.

Figure 2:
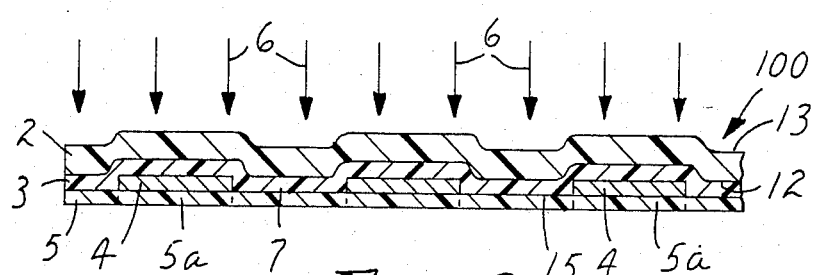
FIG. 2 is a cross-section view of the article of FIG. 1 during exposure to actinic radiation.

In FIG. 2, the article 100 is exposed to actinic radiation, depicted by arrows 6, through carrier 2. Graphic design 4 blocks passage of the actinic radiation to portions 5a of the second adhesive layer underlying graphic design 4. Exposure of a second adhesive layer between portions of graphic design 4 initiates the chemical reaction within the second adhesive layer which results in a formation of segments 7 which have reduced adhesion to the substrate to which the article 100 is to be applied relative to the adhesion to that substrate of the unexposed adhesive sections 5a.

Figure 3:
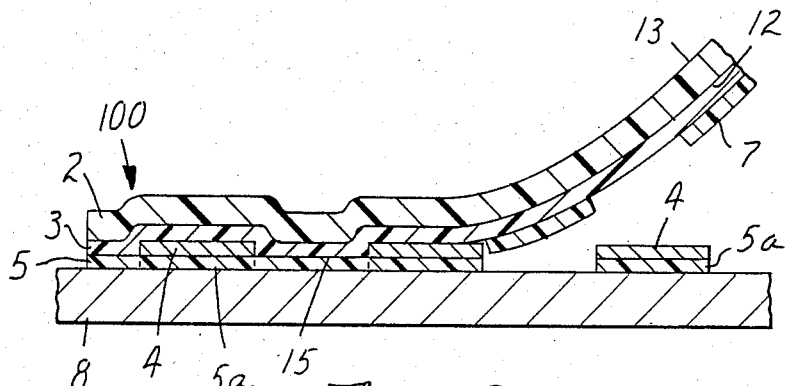
FIG. 3 is a cross-section view of the article of FIG. 2 applied to a substrate during the process of development wherein the carrier film and exposed adhesive are partially removed.

In FIG. 3, article 100 in its exposed state and exhibiting a latent, developable image, has been applied to the surface of a substrate 8 with pressure such as may be exerted by a hand drawn squeegee or roller. Development is accomplished by, for example, applying a peeling force, here shown as being from right to left, to carrier film 2. The adhesion between surface 12 of carrier film 2 and first adhesive layer 3 exceeds the adhesion between the graphic design 4 and first adhesive layer 3. Furthermore, the adhesion between first adhesive layer 3 and the exposed sections 7 of the second adhesive layer exceeds the adhesion between sections 7 and substrate 8. These adhesion differentials permit article 100 to cleave along the edges of graphic design 4 and unexposed adhesive sections 5a of the second adhesive layer and at the interface between graphic design 4 and first adhesive layer 3.

The adhesion between first adhesive layer 3 and graphic design 4 is less than the adhesion between graphic design 4 and unexposed adhesive sections 5a of the second adhesive layer and also is less than the adhesion between those same unexposed adhesive sections 5a and substrate 8. As a consequence, article 100 splits as shown in FIG. 3 leaving only graphic design 4 and unexposed adhesive sections 5a of the second adhesive layer on the surface of substrate 8. That portion of article 100 remaining after such separation may then be discarded.

The carrier must be transmissive to the actinic radiation (such as ultraviolet light) to which the second adhesive layer is responsive. Additionally, the carrier should be transparent to visible light to aid in accurately positioning the article of the invention on a substrate and should be mutually compatible with first adhesive layer 3 so that there is no degradation of the bond between the two. The carrier is also preferably conformable to compound surfaces so that it intimately follows the contour of such surfaces without forming air bubbles or wrinkles which would either detract from the aesthetic appearance of the graphic design or adversely affect the adhesion of the graphic design to the substrate after development.

The carrier may be selected from a variety of materials. For example, polymeric materials such as polyethylene, polypropylene, and flexible poly(vinyl chloride) films and copolymers of ethylene, propylene and vinyl chloride may be used. Moreover, surface 12 of the carrier may have either a smooth or matte finish depending upon the type of finish which is to be imparted to the graphic design. Preferably the carrier is from 0.05 to 0.2 mm thick.

The carrier should also be free, or contain no more than limited quantities of additives which might bloom or migrate to the interface between the carrier surface and the first adhesive layer and thereby interfere with the development of the appropriate bond between the two.

Representative examples of commercially available films useful as the carrier include Crown 136 (an unoriented polypropylene film manufactured by the Crown Zellerbach Corporation), Crown 190 (an unoriented high density polyethylene film manufactured by Crown Zellerbach Corporation), and flexible poly(vinyl chloride) films.

The first adhesive layer should be transmissive to actinic radiation. Thus, it may be either responsive or non-responsive to the actinic radiation provided that the proper adhesive and cohesive forces be maintained between it and the other layers it contacts throughout preparation, exposure and development of the article and that it permit sufficient actinic radiation to reach the second adhesive layer to permit that layer to respond to the radiation.

Preferably the first adhesive layer demonstrates a 180° peel strength to the carrier of from 20 to 50 grams per centimeter width. The peel strength may be measured by priming a 2.54 cm wide sample of unoriented polypropylene film as described in Example 1 and coating the primed surface to a wet thickness of 0.1 mm of the first adhesive composition. After drying, the construction is laminated to a film which has the same composition as the ink of Example 1. A 2.2 kg roller is passed once over the construction to laminate the film to the adhesive. The film is separated from the adhesive using a Keil Tester, manufactured by Dow Corning Corporation and the force necessary to bring about separation is reported as the 180° peel strength. Additionally, the first adhesive layer preferably demonstrates no adhesion build-up to the graphic design after exposure to 25° C. for seven days or upon exposure to ultraviolet light.

The first adhesive layer serves at least two functions. First, it is used during the manufacture of the graphic design article. In this function it must have sufficient adhesive strength to lift the graphic design off an intermediate substrate. Second, it is used during application of the graphic design to the final substrate. In this function it holds the graphic design in place on the article of the invention and prevents its premature adhesion to the final substrate during positioning of the design. The first adhesive layer also bonds to the second adhesive layer in such a way that after exposure to actinic radiation and removal of the carrier, those portions of the two adhesive layers exposed to the actinic radiation are removed by the carrier. It is this mechanism which renders the article of the present invention self-splitting thereby making it unnecessary to employ "kiss-cutting" techniques to provide separation of the graphic design from the carrier. However, as is discussed more fully later, "kiss-cutting" may be employed if desired.

A variety of first adhesive compositions may be used as the first adhesive layer. Examples of such compositions include rubber-based and vinyl-based compositions.

Rubber-based first adhesive compositions generally comprise either synthetic or natural rubber resins. Synthetic rubber resins, such as block copolymers composed of terminal glassy resinous polymer blocks and central elastomeric blocks, are preferred.

Typically the terminal blocks of these copolymers have a glass transition temperature above room temperature (i.e., above 20° C.) The terminal blocks usually comprise up to 15 weight percent of the copolymer and have a weight average molecular weight of between 2,000 and 100,000. Styrene is one example of a group useful as the terminal block.

The elastomeric blocks of these copolymers typically have a glass transition temperature below that of the terminal blocks and comprise recurring units of a conjugated diene such as isoprene or butylene, although polyolefin units, such as ethylene, may be included in the elastomeric blocks.

Examples of commercially available synthetic rubber resins of this type are the "Kraton" series of polymers available from the Shell Chemical Company.

Natural rubber resins (i.e., cis-1-4-polyisoprene) useful in the invention are well known and can be obtained from a variety of sources.

The natural or synthetic rubber portion of the first adhesive composition may comprise from 10 to 30 weight percent of the composition and preferably from 15 to 20 weight percent of the composition.

Vinyl-based adhesives, preferably cross-linked acrylic-based compositions, typically comprise a blend of one or more acrylic resins together with one or more other reactive ingredients. However, other vinyl-type resins may be employed in addition to, or in place of, the acrylic resins. These other vinyl-type resins include, for example, polyvinyl-n-butyl acrylate, polyvinyl-n-butyl ether and polymers of acrylic acid esters and alkyl alcohols. Yet other types of useful vinyl-based adhesives are disclosed in RE 24,906. Preferably these are crosslinked by the use of a multifunctional acrylate and appropriate processing during preparation of the article of the invention.

Other useful vinyl-based adhesives comprise copolymers of alkyl acrylates, vinyl acetate and acrylic acid. For example, a composition comprising 74 parts by weight isooctylacrylate, 22 parts by weight vinyl acetate and 4 parts by weight of acrylic acid may be polymerized by conventional techniques to provide a polymer having an inherent viscosity of from 1.3 to 1.6 at 30° C. when measured at 20% by weight solids in ethyl acetate.

Multifunctional acrylates, such as trimethylol propane triacrylate, pentaerythritol triacrylate, hydantoin hexaacrylate, and triacrylate of tris(2-hydroxyethyl)isocyanurate (available as "Sartomer" SR-368 from Sartomer Resins, Inc.) may be added if desired. Such multifunctional acrylates are typically employed at levels of from 3 to 15% by weight of the adhesive solution.

Free radical initiators such as benzophenone, Michler's ketone, benzoin alkyl ethers, acetophenones may then be added at concentrations of from 0.5 to 5% by weight.

A test has been developed to assist in identifying suitable first adhesive compositions. In this test the first adhesive to be tested is coated onto a sheet of 0.1 mm thick poly(vinyl chloride) film at a thickness of from 0.10 to 0.50 mm. The adhesive is dried at a temperature of from 30° to 55° C. until all the solvent has been removed.

A second adhesive comprising by weight

| | |
|---|---|
| 74 parts | Isooctyl acrylate |
| 22 parts | Vinyl acetate |
| 4 parts | Acrylic acid |
| 3.5 parts | Hydantoin hexaacrylate |
| 0.5 parts | Benzophenone | is prepared by mixing the ingredients together to provide a mixture having an inherent viscosity of from 1.3 to 1.6 at 30° C. and 20% solids by weight in ethyl acetate. The adhesive composition is coated onto a silicone coated release liner (e.g., 75-W-89-SPT6A/PS from Schoeller Release Products, Inc.) at a coating weight of 12.9 g/m$^2$ to 21.5 g/m$^2$ and dried. The carrier and first adhesive and the silicone and second adhesive are laminated together such that the two adhesives contact each other. The adhesived are cured by exposure to ultraviolet light in a Linde photoprocessor using four defocussed mercury vapor lamps one meter above a belt moving at 21.3 meters per minute.

The silicone release liner is then removed and the second adhesive is applied to a painted steel panel and heated for one hour at 150° C. After cooling to room temperature (i.e., 18° C.) the carrier is removed. If the first adhesive being tested is suitable for use, both it and the second adhesive separate from the substrate with no ply failure (i.e., the first adhesive does not separate from the second adhesive) when the carrier is removed.

A variety of other ingredients may be added to the first adhesive layer. They include, for example, tackifiers, plasticizers, antioxidants and the like.

Tackifiers useful in the first adhesive composition are known and include, for example, rosin and rosin derivatives, polyterpene resins, coumarone-indene resins, and thermoplastic phenolic resins. Hydrogenated styrene-based resins (e.g., "Regalrez" 1194 from Hercules, Inc.) and siloxane gums are also useful in tackifying the adhesive composition. An example of a useful commercially available siloxane gum is "PSA" 590 from the General Electric Company. This siloxane gum comprises 60% by weight polydimethyl siloxane gum and polysiloxane resin in toluene.

Tackifiers useful in the first adhesive composition may comprise up to 20 weight percent thereof, and preferably they comprise from 3 to 15 weight percent.

Plasticizers useful in the first adhesive composition improve the processability and flexibility of the adhesive composition. They may comprise up to 20 weight percent and preferably from 5 to 10 weight percent of the composition. Suitable plasticizers are known to those in the art and include parafinic naphthenic oils (e.g., "Tufflo", specific gravity at 25° C. of 0.86, from Atlantic Richfield Corp.), dioctylphthalate, and the like.

Antioxidants useful in the first adhesive composition prevent degradation due to oxidation and typically comprise up to 2 weight percent of the first adhesive. Examples of useful antioxidants include "Irganox" 1010 (a hindered phenol available from Ciba-Geigy Corp.), "Tinuvin" 770 (a hindered amine available from Ciba-Geigy Corp.), and quinones.

Still other ingredients useful in the first adhesive composition include adhesion promoters, ultraviolet light absorbers, flow aids, and the like. Such other ingredients may each comprise up to 15 weight percent of the first adhesive composition.

Priming agents and techniques may be employed to improve the adhesion of the first adhesive layer to the carrier. Priming agents and techniques are particularly useful when the carrier comprises polyethylene or polypropylene. Priming agents typically comprise a layer of a priming composition, while primary techniques typically comprise a surface treatment such as corona treatment.

The first adhesive layer may be coated onto the carrier from a solution and the solvent then removed, preferably by heating at a temperature lower than a softening point of the carrier. Further processing of the adhesive layer is not necessary if a rubber-based adhesive has been used. If an acrylic-based adhesive has been used, the coating is preferably then exposed to ultraviolet light to crosslink the acrylate materials. In either event, it is preferred that the first adhesive layer have a thickness in the range of from 0.02 to 0.3 mm and preferably a thickness in the range of from 0.03 to 0.15 mm.

The material which comprises the graphic design in the invention may be comprised of colored or non-colored (i.e., visibly transparent) ink compositions. Non-colored (i.e., clear) inks will typically be used as protective top coats or layers over the colored inks. In any event, the ink compositions should be opaque to the actinic radiation to which the second adhesive layer is responsive. Opacity in the context of this invention means that the ink, as deposited on the first adhesive layer in one or more layers, will block passage of sufficient actinic radiation relative to those portions of the first adhesive layer free of such ink that a latent pattern defined by chemically reacted and unreacted adhesive in the second adhesive layer is provided which can be physically developed as has been described.

The ink formulations useful herein preferably contain a polymeric component, preferably a high tensile strength polymer or resin such as polyvinyl butyral, cellulose nitrate, cellulose acetate, alkyds and alkyds modified or copolymerized with drying oil, styrene, urethane, vinyl, acrylic resin, polyvinylhalides, polyurethanes, urethane-acrylates, epoxy polymers, epoxy-phenolic, epoxy-polyamide and catalyzed epoxy resins and copolymers, chlorinated and isomerized rubber, polystyrene and polyvinyl toluene, polyacrylates, polymethacrylates, and thermosetting acrylic resins. The ink may be applied as a solution, dispersion or emulsion in organic solvent medium or water, the solvent or water being removed after application. Any convenient pigment well known for use in printing inks may be used in the ink formulations including pigments modified by coating the pigment particles with surface active agents to improve dispersibility and increase covering power.

The ink may be applied by a variety of conventional coating or printing techniques. Screen printing is a preferred technique. The resultant graphic can be a monolayer or multi-layers, and can be a mono-color or multi-color image. It typically ranges in overall thickness from 0.0075 mm to 0.025 mm.

The second adhesive layer employed in the invention is an actinic radiation sensitive, generally ultraviolet light sensitive, composition. It typically ranges from 0.005 mm to 0.025 mm, preferably 0.005 mm to 0.01 mm, in thickness and is preferably either a normally tacky (at room temperature) pressure sensitive adhesive or a heat activatable adhesive. The adhesive is modifiable by exposure to actinic radiation which reduces tack and increases cohesive strength relative to unexposed adhesive. Unexposed adhesive retains its high tack qualities and integrity to provide high resistance of the article to abrasion, marring, natural environments; e.g., weathering, and adhesion to common substrates such as metal, paint, wood, glass, and plastics.

The second adhesive must exhibit sufficient adhesion properties so that when the article of the invention is being positioned on a substrate, the adhesive will hold the article in place yet permit it to be repositioned and, upon application of pressure, permanently retain the graphic on the substrate in severe environments.

A number of adhesive systems may be used as the second adhesive layer. They may be the same as the first adhesive layer, provided that the first adhesive layer is responsive to actinic radiation. Preferably the second adhesive composition comprises a vinyl-containing composition of the type described above for use as the first adhesive layer.

Still other compositions are useful as the second adhesive. For example, an adhesive composition comprising a reactant system containing from about 5–25% of an oxirane ring containing component such as glycidyl acrylate, glycidyl methacrylate, or glycidyl allyl ether is useful. This reactant system further may contain from about 75% to about 95% by weight of one or more additional vinyl containing reactive monomers.

Also present in this oxirane ring containing adhesive composition is an effective amount generally on the order of 3% by weight of the reactant system, of an ionic photoinitiator capable of promoting polymerization of the oxirane rings. Examples of useful photoinitiators are the radiation-sensitive aromatic onium salts of group Va and VIa as respectively disclosed in U.S. Pat. Nos. 4,069,066 and 4,058,401, certain diaryl halonium salts containing group Va metal hexafluorides as disclosed in U.S. Pat. No. 3,981,897, certain onium catalysts of Groups Va, VIa and VIIa atoms as disclosed in U.S. Pat. No. 4,101,513, and triarylsulfonium complex salts of the formula

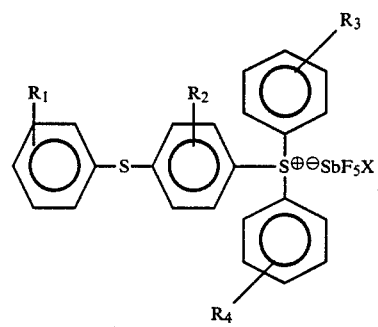

where X is F or OH and $R_1$, $R_2$, $R_3$, and $R_4$ are each selected from H, lower alkyl, alkoxy or halogen.

Second adhesive layers of this type are disclosed more fully in U.S. Pat. No. 4,454,179.

Exposure of the second adhesive layer to actinic radiation through the carrier film alters the properties of the second adhesive layer in the non-graphic areas. The graphic serves as a mask to actinic radiation, thereby leaving the second adhesive layer beneath the graphic unchanged. The radiation induced changes in the adhesive properties of the second adhesive layer include reduced tack and increased cohesive strength. Upon application of the article to a substrate, the reduced tack of the second adhesive layer in the non-graphic areas permits easy removal of the exposed second adhesive layer, the first adhesive layer, and carrier film. The cohesive strength difference between the exposed and non-exposed adhesive permits the second adhesive layer to cleave precisely at the perimeter of the ink.

Figure 4:
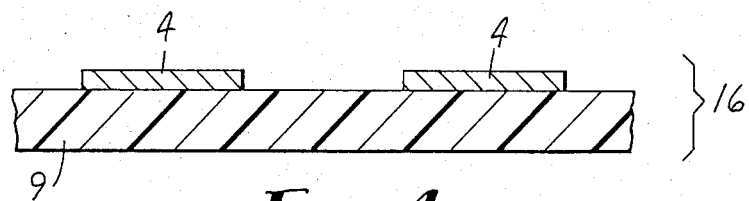
FIGS. 4–8 are cross-section views of a method of manufacturing the article of the invention.

FIGS. 4–8 demonstrate one technique for making the article of the invention. In FIG. 4 a layer of ink composition is selectively applied to a release liner 9 to provide a structure 16 bearing graphic design 4. One or more layers of ink may be applied if desired to provide a multi-color graphic, or, as previously noted, to provide a clear coating over the final graphic design. The ink is allowed to dry or cure depending on the type of ink employed. Screen printing is the preferred ink application method although many conventional coating and printing techniques may be employed.

A variety of techniques may be utilized to apply a non-colored or clear layer is over the graphic 4. For example, the clear coating may be applied in exact registry over the graphic. When this application technique is utilized, the final article retains the ability to be self-splitting.

Alternatively, the clear coating may be applied so as to cover the graphic design 4 and the surface of release liner 16 not covered by the graphic design. When this application technique is utilized, the article of the invention must generally be "kiss-cut" before application of the premask tape 10 shown in FIG. 5. In either event, the clear coating is applied so that after application of the article of the invention to a substrate, the clear coating is the outermost layer.

Figure 5:
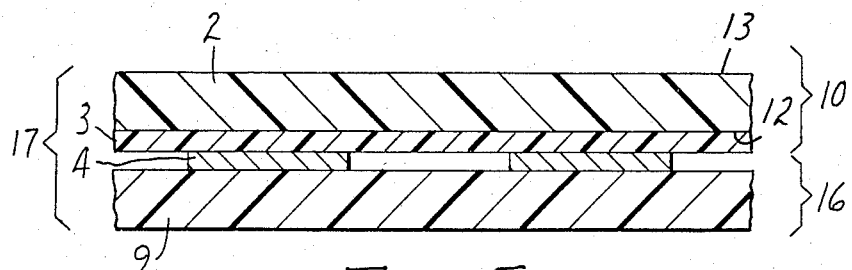

Structure 16 is then applied to a premask tape 10 as shown in FIG. 5. Premask tape 10 comprises carrier 2 and first adhesive layer 3 and is prepared as described above. Premask tape 10 and structure 16 are placed in face-to-face contact with graphic design 4 contacting first adhesive layer 3. The resulting construction 17 may then be passed through rubber rolls which apply sufficient pressure to cause graphic design 4 to adhere to first adhesive layer 3 with greater force that it adheres to release liner 9. Typically forces of 20 g/cm to 60 g/cm are sufficient to accomplish this.

Figure 6:
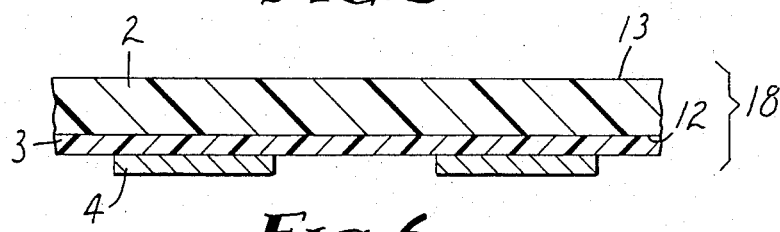
Figure 7:
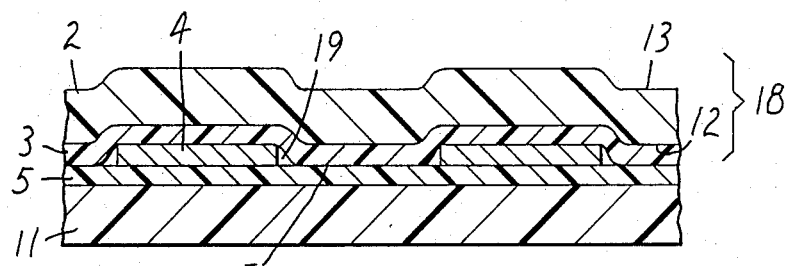

Release liner 9 is then removed from construction 17 to provide the multilayer film 18 shown in FIG. 6. Film 18 may then be corona treated (not shown) to insure that the surface made up of the graphic design 4 and the first adhesive layer 3 will have the proper adhesion to the second adhesive layer. Such treatment is particularly preferred when urethane-based ink systems are used as the graphic design. Treatment may be accomplished by exposure to a corona discharge in a ENI Power Systems Model RS-8 Corona Surface Treater) to provide increased surface free energy.

Figure 8:
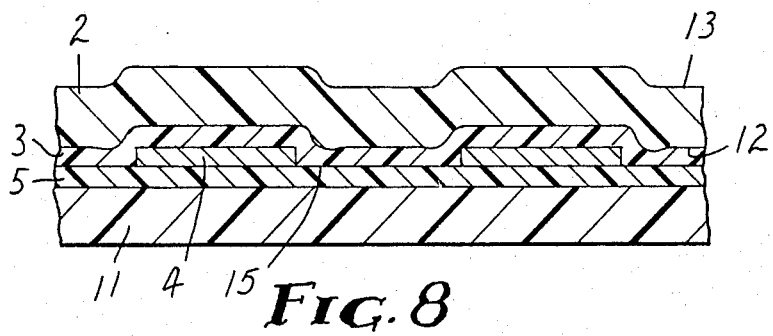

After the corona treatment (if used), the second adhesive layer 5 may be applied either by coating and drying a layer of the second adhesive directly onto the graphic and first adhesive layer surface or by using a transfer technique. In the transfer technique, the second adhesive composition 5 is coated onto a release liner such as silicone-coated paper 11 (see FIG. 7) using conventional coating and drying techniques. The resulting construction may then be laminated to film 18 to provide the article shown in FIG. 7. Although the lamination causes the carrier 2 and first adhesive layer 3 to generally conform to and surround the graphic design 4, it does not eliminate all spaces 19 between the first adhesive layer 3 and the graphic design 4. Spaces 19 may be removed by applying a rotating brush to surface 13 of carrier 2 to force the carrier 2 and first adhesive layer 3 around the graphic design 4 and against second adhesive layer 5 as shown in FIG. 8. To aid in achieving this result, it is preferred that carrier 2 be a material which is slightly softenable when heated. This step insures that the article of the invention will split cleanly along the edges of the graphic design after exposure to actinic radiation and removal of the carrier.

The resulting article may then be exposed to actinic radiation through the free major surface of the carrier film for a period of time sufficient to initiate the chemical reaction of the second adhesive layer in the non-ink areas. After exposure, the release liner is removed and the article positioned on the desired substrate. Moderate pressure is applied by stroking a squeegee across the face of the carrier film. The carrier film is then grasped manually and peeled away, taking with it the exposed first and second adhesive layers and leaving the graphic design bonded to the substrate by means of unexposed, underlying second adhesive. If necessary, further pressure can be applied to the ink surface to assure a stronger bond to the substrate.

In the following examples, all parts and percentages are by weight unless otherwise stated.

EXAMPLE 1

A self-splitting graphic design article according to the invention was prepared. Polypropylene resin (Polypropylene 3300, an extrudable polypropylene sold by Norchem Corporation having a number average molecular weight of 320,000) was extruded at a die temperature of 217° C. to form an unoriented 0.075 mm thick film. One surface of the film was corona treated at 500 watts for a 0.75 meter width at a speed of 20 m/min. The coronatreated film was then primed with a layer of a composition containing

| Component | Description | Weight |
|---|---|---|
| Neoprene W | Polychloroprene (E. I. Du Pont de Nemours and Company, Inc.) MW 180,000–200,000 | 5.0% |
| Mondur CB-75 | Trimethylol propane - Toluene diisocyanate polymer (Mobay Chemical Corp.; 75% solids in Toluene; NCO content 13–14%; Equivalent Wt. 311) | 0.3% |
| Ucar Phenolic Resin | p-tert-Butylphenol-formaldehyde polymer (Union Carbide Corp.) | 1.0% |
| Toluol | | 93.7% |

The primer was applied with a 150 knurled cylinder. After coating, the toluol was removed by air convection in an oven at 40° C.

A first adhesive layer was applied to the primed surface of the polypropylene film from the following composition.

| Component | Description | Weight % |
|---|---|---|
| "Kraton" GX 1657 | Polystyrene/poly(ethylene-butylene)/ polystyrene block copolymer (14% polystyrene); specific gravity 0.9; solution viscosity (20% by weight in toluol, 1100 cps; available from Shell Chemical Co.) | 20.7 |
| "Tufflo" 6056 | Paraffinic naphthenic oil (Specific gravity at 25° C. of 0.86; available from Atlantic Richfield Corp.) | 6.0 |
| "Regelrez" 1094 | Hydrogenated styrene-type polymer (Available from Hercules, Inc.) | 6.0 |
| "PSA" 590 | 60% Polydimethylsiloxane gum and polysiloxane resin in toluene (Available from General Electric Company) | 4.3 |
| "SR" 545 | 60% Silicone resin in toluene (Available from General Electric Company) | 2.1 |
| "Irganox" 1010 | Hindered phenolic antioxidant $M_w$ 1178; available from Ciba-Geigy Corp.) | 0.2 |
| Toluol | | 61.7 |

The composition was knife coated to a wet thickness of 0.13 mm. The solvents were then evaporated from the composition by a convection oven at 40° C. The resulting adhesive-coated polypropylene was then rolled up on itself and stored for subsequent use.

A graphic design was screen printed on a 118 g/m$^2$ leached low mositure base paper coated with 37.5 μm (36 g/m$^2$) of high density polyethylene (HDPE). This paper is manufactured by Schoeller Technical Papers, Inc. The following ink formulation was used to provide the graphic design. It was printed with a 110 mesh screen onto the HDPE surface of the paper.

| Component | Description | Weight % |
|---|---|---|
| "VYHH" Resin | 87% Polyvinyl chloride/13% polyvinyl acetate copolymer (Inherent viscosity; 0.49–0.52, ASTM-D-1243 Method A, available from Union Carbide Corp.) | 22.0 |
| "Raven" 1200 | Carbon black pigment (Available from City Service, Inc.) | 7.7 |
| Dioctyl-phthalate | | 4.3 |
| Cyclohexanone | | 33.0 |
| Isophorone | | 33.0 |

The ink formulation was prepared by dissolving the polyvinyl chloride/polyvinyl acetate copolymer in the cyclohexanone, isophorone and diooctylphthalate. The carbon black was ground into this solution using a three roll paint mill to a fineness of grind of at least 8 on the P.C. scale. The resulting mixture was diluted with isophorone as needed to provide a viscosity of 1300 cps using a Brookfield viscometer No. 3 spindle. After the ink is printed, the solvents were evaporated in an air convection oven at 50° C.

A non-pigmented, non-adhesive composition was screen printed using a 110 mesh screen in registration with the graphic design. This protective clear coat had the following formulation:

| Component | Description | Weight % |
|---|---|---|
| "Desmo-phen" 651A-65 | Rigid polyester polyol (Viscous liquid, 65% solids in ethyl glycol acetate; equivalent Wt. of 325; % hydroxyl of 5.2; available from Mobay Chemical, Inc.) | 46.50 |
| "Desmo-phen" 670-90 | Flexible polyester polyol (Viscous liquid, 100% solids; equivalent wt. of 395; % hydroxyl of 4.3; available from Mobay Chemical, Inc.) | 12.50 |
| "Desmodur" N-100 | Aliphatic polyisocyanate (Viscous liquid, 100% solids; equivalent wt. of 190; % NCO of 22; available from Mobay Chemical, Inc.) | 31.00 |
| "Tinuvin" 770 | Hindered amine stabilizer (Available from Ciba Geigy, Inc.) | 0.9 |
| "Tinuvin" 328 | Benzotriazole UV absorber (Available from Ciba Geigy, Inc.) | 3.0 |
| "Multiflow" | An acrylic copolymer resin solution 50% in xylene; specific gravity 25/25° C. of 0.925–0.940; refractive index at 25° C. of 1.481–1.485; available from Monsanto Industrial Chemicals Co.) | 1.8 |
| FC-430 | Fluorocarbon flow additive (Available from 3M Co.) | 1.0 |
| "Carbitol" acetate | Diethylene glycol monoethyl ether acetate (available from E. I. du Pont de Nemours, Inc.) | 5.1 |

The non-pigmented formulation was prepared by mixing the components together in a Cowles mixer. The formulation was diluted with "Carbitol" acetate to a viscosity of 500 cps (Brookfield viscometer No. 3 spindle). After the non-pigmented layer was printed, the construction was baked for two hours at 55° C.

The HDPE coated paper bearing the graphic design was laminated to the previously described adhesive coated polypropylene carrier so that the first adhesive layer and the graphic were in contact by passing the construction between soft rubber rolls each having a 70 Durometer hardness such that a pressure of 67.7 newtons/cm$^2$ was applied. The HDPE coated paper was then removed and discarded.

The resultant structure was corona treated on the surface bearing the first adhesive and graphic by exposing the structure to a 500 watt corona discharge at a speed of 20 m/min.

A continuous second adhesive layer was then applied over the graphic and the first adhesive layer from the following composition:

| Component | Description | Weight % |
|---|---|---|
| Adhesive Polymer | 74% isooctyl acrylate/22% vinyl acetate/4% acrylic acid | 19.6 |
| "Sartomer" SR-368 | A triacrylate of tris(2-hydroxy-ethyl) isocyanurate (Available from Sartomer Chemical Co.) | 2.0 |
| Benzophenone | | 0.2 |
| Ethyl acetate | | 78.2 |

This adhesive formulation was prepared by mixing the ingredients together at room temperature, coating the solution onto a silicone coated, white polyethylene sheet (05-4-HiD-ST6A/ST3A-White from Schoeller Release Products, Inc.) to a wet thickness of 0.075 mm, and evaporating the solvent by heating the film for 3 minutes at 58° C.

The corona treated, graphic design bearing, adhesive coated polyethylene carrier was laminated to the second adhesive layer such that the second layer of adhesive contacted the corona treated surface of the first adhesive layer and the graphic design. The lamination was passed between rubber rolls (70 Durometer hardness) at a pressure of 67.7 newtons/cm$^2$. This lamination was then passed over an oil-heated can at a temperature of 82° C. As the lamination passed over the hot can the unoriented polypropylene carrier side of the lamination was vigorously brushed with a coarse rotating brush to insure good lamination of the two adhesive layers and eliminate any air spaces between the first layer of adhesive at the edges of the graphic design.

The laminated article was then passed through a Linde Photocure System at a speed of 10 meters/minute with the polypropylene carrier side facing four medium pressure mercury vapor lamps. The lamps were 0.75 meters above the lamination and had an intensity of 31 watts/cm$^2$. The silicone coated polyethylene film was removed and the article placed on a steel substrate such that the second layer of adhesive was against the surface of the steel substrate. Moderate pressure was applied to the free surface of the carrier film by stroking that surface with the edge of a polyethylene squeegee (3M Company PA-1 plastic applicator tool) over the film structure. The carrier film was then peeled off the substrate surface leaving the graphic design on the substrate. No adhesive remained on the top or the edges of the graphic or on the surfaces of the substrate where there was no graphic design.

EXAMPLE 2

Example 1 was repeated with the following changes. Protective clearcoat formulation comprised:

| Component | Description | Weight % |
|---|---|---|
| XP-173-09 | Aliphatic urethane acrylate oligomer diluted with 25% 2-ethylhexylacrylate (Viscosity at 20° C.; 21,000 ± 2000 cps available from Cargill, Inc.) | 64.3 |
| Tetraethylene glycol diacrylate | $M_w$ of 302 (Available from Celanese Co.) | 21.7 |
| N—vinyl-2-pyrrolidone | Colorless liquid, Bp 146° C., $M_w$ of 111 (Available from GAF Corp.) | 10.0 |
| "Multiflow" | Monsanto Industrial Chemicals Company | 2.0 |
| Diethoxyacetophenone (DEAP) | Upjohn Chemical Co. | 2.0 |

The formulation was prepared by mixing the components at room temperature until a homogeneous mixture is achieved.

The formulation was printed in registration with the ink layer using approximately 110 mesh screen. The protective clearcoat was cured by actinic radiation in a Linde Photocure System with four defocussed medium pressure mercury vapor lamps. The lamps were 0.75 meters above the coating. The bulbs had an intensity of 31 watts/cm$^2$. The belt speed of the curing unit was 10 meter/minute. Nitrogen was passed through the curing chamber at a rate of 225 cubic feet of $N_2$/ft. width of curing chamber to provide a nitrogen environment therein.

A second adhesive layer was applied using the formulation and procedures described in Example 1. The self-splitting graphic design article was then processed and applied to a steel substrate described in Example 1. After the carrier film was peeled off the substrate surface, the graphic design was left on the substrate. No adhesive remained on the top or the edges of the graphic or on the surfaces of the substrate where there was no graphic design.

EXAMPLE 3

Example 1 was repeated except that the following single layer graphic design formulation was substituted for the dual layer graphic design used.

| Component | Description | Weight % |
|---|---|---|
| "Desmophen" 670-90 | Available from Mobay Chemical Inc. | 20.4 |
| "Desmophen" 651A-65 | Available from Mobay Chemical Inc. | 27.4 |
| "Tinuvin" 770 | Bis(2,2,6,6-Tetramethyl-4-piperidinyl)sebacate (Available from Ciba Geigy) | 0.7 |
| "Tinuvin" 328 | Benzatriazole (Available from Ciba Geigy) | 1.3 |
| "Raven" 1200 | Carbon black (Available from City Services, Inc.) | 4.6 |
| "Multiflow" | Available from Monsanto Industrial Chemicals Company | 1.5 |
| "Desmodur" N-100 | Available from Mobay Chemicals Inc. | 27.5 |
| Butyl Cellosolve Acetate | | 17.6 |

The polyol resins, the stabilizers, the flow additives, and solvent were all mixed together. The carbon black was ground into the polyol solution using a three roll paint mill to a fineness of grind of at least 8 on the P.C. scale. Just prior to screen printing the graphic design formulation, the isocyanate was added to the solution. This composition was then diluted to 800 cps using a Brookfield viscometer, No. 3 spindle. The graphic design composition was screen printed on the HDPE coated paper from Schoeller Technical Papers, Inc. described in Example 1 with a 110 mesh screen. The carrier bearing the graphic design formulation was baked for 2 hours at 68° C. to remove solvents and speed up the reaction between the isocyanate and the polyols. When the resultant self-splitting graphic design article was processed and applied to a steel substrate as described in Example 1, it was found that the carrier film peeled off the substrate surface leaving the graphic design on the substrate. No adhesive remained on the top or the edges of the graphic design or on the surfaces of the substrate where there was no graphic design.

EXAMPLE 4

Example 1 is repeated except that the following second adhesive composition was used.

| | |
|---|---|
| Adhesive polymer* | 25.0 |
| Ethyl Acetate | 73.5 |
| Triphenyl sulphonium hexafluoro antimonate (Photosensitive Lewis acid generator) | 1.5 |

*Adhesive polymer composition

| | |
|---|---|
| Isooctyl acrylate | 63.0 |
| Methyl acrylate | 25.0 |
| Glycidyl methacrylate | 10.0 |
| Hydroxyethyl acrylate | 0.5 |
| Acrylamide | 1.5 |
| I.V. 0.7–0.8 | |

The second adhesive composition was applied, and the resultant self-splitting graphic processed and applied as described in Example 1. When the carrier film was peeled off the substrate, it was found that the carrier film peeled off the substrate surface leaving the graphic design on the substrate. No adhesive remained on the top or the edges of the graphic design or on the surfaces of the substrate where there was no graphic design.

EXAMPLE 5

Example 1 was repeated except that the following first adhesive composition was employed.

| Component | Description | Weight % |
|---|---|---|
| Natural Rubber | 95% cis/5% trans-1,4 poly-isoprene $M_w$ 100,000–1,000,000 Source-Any reputable rubber broker provided that the originating source is Indonesia, Maylasia, or Sri Lanka Grade #IRSS. | 7.5 |
| "Piccolyte" S-115 | 85–90% beta pinene resin/10–15% alpha pinene resin (Available from Hercules, Inc.) | 0.8 |
| Plastanox 2246 Antioxidant | 2,2'-Methylene-bis-(4-methyl-6-tertiary butyl phenol) $M_w$ 304.5 Source-American Cyanamid Co. | 0.4 |
| "PSA" 590 | Available from General Electric Company; 60% polydimethylsiloxane resin in toluol | 1.1 |
| Mineral Oil | | 0.4 |
| Heptane | | 88.2 |
| Ethyl Alcohol | | 1.6 |

This composition was prepared by mixing the ingredients together at room temperature until a solution was obtained. It was then applied according to the procedures described in Example 1.

When the resultant self-splitting graphic design article was processed and applied to a steel substrate as described in Example 1, it was found that the carrier film peeled off the substrate surface leaving the graphic design on the substrate. No adhesive remained on the top or the edges of the graphic design or on the surfaces of the substrate where there was no graphic design.

What is claimed is:

1. A dry article for transferring a graphic design to a substrate comprising
   (a) a carrier which is transparent to actinic radiation;
   (b) an actinic radiation transmissive first adhesive layer on said carrier, which first adhesive layer presents a major surface having first and second surface portions thereon;
   (c) a graphic design on said first surface portions which is opaque to actinic radiation; and
   (d) a continuous actinic radiation responsive second adhesive layer which covers said graphic design and said second portions of said first adhesive layer; wherein, upon a single exposure of said article to actinic radiation through said carrier and application of said article to said substrate and removal of said carrier, said first adhesive layer and said second adhesive layer on said second surface portions of said first adhesive layer are selectively removed from said substrate leaving only said graphic design and said second adhesive layer in registry therewith on said substrate.

2. The article of claim 1 wherein said carrier has at least one surface comprising a material selected from the group consisting of polyethylene, polypropylene or poly(vinyl chloride) and copolymers of ethylene, propylene, and vinyl chloride.

3. The article of claim 1 wherein said first adhesive layer is selected from a rubber-based composition and a vinyl-based composition.

4. The article of claim 3 wherein said first adhesive layer comprises a vinyl-based composition.

5. The article of claim 4 wherein said vinyl-based composition further comprises one or more multi-functional cross-linkable materials and a cross-linking initiator therefore.

6. The article of claim 5 wherein said multifunctional cross-linkable materials comprise multifunctional acrylates and said cross-linking initiator comprises a photoinitiator.

7. The article of claim 6 wherein said vinyl-based composition comprises from 15 to 25 weight percent of a terpolymer of isooctyl acrylate, vinyl acetate and acrylic acid, from about 3 to 15 weight percent of a multifunctional acrylate selected from the group consisting of trimethylol propane triacrylate, pentaerythritol triacrylate, hydantoin hexaacrylate, and a triacrylate of tris(2-hydroxyethyl) isocyanurate, and from 0.5 to 5 weight percent of a photoinitiator.

8. The article of claim 3 wherein said first adhesive layer comprises a rubber-based composition.

9. The article of claim 8 wherein said rubber-based composition comprises a synthetic rubber block copolymer having terminal glassy resinous polymer blocks and central elastomeric blocks.

10. The article of claim 9 wherein said rubber-based composition comprises from 10 to 30 weight percent of said synthetic rubber resin and from 3 to 15 weight percent of a tackifier.

11. The article of claim 8 wherein said rubber-based composition comprises natural rubber resin.

12. The article of claim 1 wherein said graphic design is comprised of a poly(vinyl chloride) polymer base, a polyurethane polymer base, a polyurethane-polyacrylate copolymer base, or a polyacrylate polymer base.

13. The article of claim 1 wherein said second adhesive layer is comprised of a vinyl-based composition further comprising one or more multifunctional cross-linkable materials and a cross-linking initiator therefore.

14. The article of claim 13 wherein said multifunctional cross-linkable materials comprise multifunctional acrylates and said cross-linking initiator comprises a photoinitiator.

15. The article of claim 14 wherein said vinyl-based composition comprises from 10 to 25 weight percent of a terpolymer of isooctyl acrylate, vinyl acetate and acrylic acid, from about 3 to 15 weight percent of a multifunctional acrylate selected from the group consisting of trimethylol propane triacrylate, pentaerythritol triacrylate, hydantoin hexaacrylate, and a triacrylate of tris(2-hydroxyethyl) isocyanurate, and from 0.5 to 5 weight percent of a photoinitiator.

16. The article of claim 1 wherein said second adhesive layer is comprised of an effective amount of an ionic photoinitiator and the reaction product of a reactive system comprising an oxirane-ring containing vinyl compound and at least one additional vinyl-containing monomer.

17. The article of claim 1 wherein said carrier is polypropylene, said first adhesive layer is comprised of a synthetic rubber composition block copolymer having terminal glassy resinous polymer blocks and central elastomeric blocks; said graphic design is comprised of a polyurethane polymer base, and said second adhesive layer is comprised of a vinyl-based composition containing one or more multifunctional cross-linkable materials and a photoinitiator therefore.

18. The article of claim 1 wherein said second adhesive layer comprises from 10 to 25 weight percent of a terpolymer of isooctyl acrylate, vinyl acetate, and acrylic acid, from about 3 to 15 weight percent of a multifunctional acrylate selected from the group consisting of trimethylol propane triacrylate, pentaerythritol triacrylate, hydantoin hexaacrylate, and a triacrylate of tris(2-hydroxyethyl) isocyanurate, and from 0.5 to 5 weight percent of a photoinitiator.

19. A self-splitting article according to claim 1.

20. The article of claim 1 wherein said carrier is capable of conforming intimately to compound surfaces.

21. The article of claim 1 further comprising a primer layer interposed between said carrier and said first adhesive layer.

22. The article of claim 1 wherein a clear protective ink layer is interposed between said graphic design and said second adhesive layer in registry with said graphic design.

23. The article of claim 1 wherein said graphic design comprises a multicolor design.

24. The article of claim 1 further comprising a protective liner over said second adhesive layer.

25. The article of claim 1 wherein said first adhesive layer has a 180° peel strength to said carrier of from 20 to 50 grams per centimeter width.

26. The article of claim 1 wherein said graphic design and said second surface portions of said first adhesive layer have been corona discharge treated prior to application thereto of said second adhesive layer.

27. A process for making a dry article for applying a graphic design to a substrate comprising the steps of (a) providing a continuous, actinic radiation-transparent carrier, (b) applying a layer of an actinic radiation transmissive first adhesive composition to a major surface of said carrier so as to provide first and second portions thereon; (c) applying an actinic radiation opaque graphic design, to said first portions of said first adhesive layer, and, (d) applying a continuous layer of actinic radiation-responsive second adhesive composition over said graphic design and said second surface portions of said first adhesive layer;

wherein, upon a single exposure of said article to actinic radiation through said carrier and application of said article to said substrate and removal of said carrier, said first adhesive layer and said second adhesive layer and said second surface portions of said first adhesive layer are selectively removed from said substrate leaving only said graphic design and said second adhesive layer in registry therewith on said substrate.

28. A process according to claim 27 wherein a primer layer is interposed between said carrier and said first adhesive layer prior to applying said first adhesive layer.

29. A process according to claim 27 wherein said graphic design and said second surface portions of said first adhesive layer have been corona discharge treated prior to application thereto of said second adhesive layer.

30. A method of on-site application of a graphic design to a substrate comprising the steps of (i) providing a graphic design transfer article comprising (a) a continuous, actinic radiation-transparent carrier, (b) a layer of an actinic radiation transmissive first adhesive composition on a major surface of said carrier so as to provide first and second surface portions thereon; (c) an actinic radiation opaque graphic design, on said first portions of said first adhesive layer, (d) a continuous layer of actinic radiation-responsive second adhesive composition on said graphic design and said second surface portions of said first adhesive layer; (ii) exposing said article a single time to actinic radiation through said carrier such that said graphic design masks passage of said actinic radiation to said second adhesive layer in registry with said graphic design while the remainder of said second adhesive layer is exposed to said actinic radiation; (iii) applying said exposed article to a substrate with said second adhesive layer in contact with said substrate; and (iv) peeling said carrier from said substrate to allow selective separation of said carrier together with exposed first and second adhesive layers from said substrate along the surface and edges of said graphic design, leaving said graphic design and said first layer of adhesive in registry therewith on said substrate.

31. An article for the dry transfer of discrete graphic indicia from a carrier to a substrate following a single exposure to actinic radiation comprising in order
    (a) a conformable, actinic radiation transparent carrier,
    (b) an actinic radiation transmissive first adhesive layer on said carrier,
    (c) first portions on said first adhesive layer bearing graphic indicia which are opaque to actinic radiation,
    (d) second portions on said first adhesive layer which are free from said graphic indicia, and
    (e) a continuous, actinic radiation responsive adhesive layer covering said graphic design and said second portions.

* * * * *

UNITED STATES PATENT AND TRADEMARK OFFICE
CERTIFICATE OF CORRECTION

PATENT NO. : 4,640,727

DATED : February 3, 1987

INVENTOR(S) : Jeffrey R. Janssen

It is certified that error appears in the above-identified patent and that said Letters Patent is hereby corrected as shown below:

Col. 2, line 42, "radation" should read --radiation--.

Col. 7, line 67, "adhesived" should read --adhesives--.

Col. 11, line 21, "that it" should read --than it--.

Col. 12, line 16, "coronatreated" should read --corona-treated--.

Col. 12, line 66, "mositure" should read --moisture--.

Signed and Sealed this

Fifteenth Day of May, 1990

Attest:

HARRY F. MANBECK, JR.

*Attesting Officer*     *Commissioner of Patents and Trademarks*